(12) United States Patent
Suganaga

(10) Patent No.: US 6,352,800 B1
(45) Date of Patent: Mar. 5, 2002

(54) RETICLE FOR USE IN EXPOSING SEMICONDUCTOR, METHOD OF PRODUCING THE RETICLE, AND SEMICONDUCTOR DEVICE

(75) Inventor: Toshifumi Suganaga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/549,931

(22) Filed: Apr. 14, 2000

(30) Foreign Application Priority Data

Oct. 1, 1999 (JP) .......................................... 11-280928

(51) Int. Cl.[7] .............................................. G03F 9/00
(52) U.S. Cl. ...................................................... 430/5
(58) Field of Search ....................... 430/5, 322; 716/20, 716/21

(56) References Cited

U.S. PATENT DOCUMENTS 5,446,587 A * 8/1995 Kang et al. ..................... 430/5
5,786,116 A * 7/1998 Rolfson ........................... 430/5

FOREIGN PATENT DOCUMENTS

| JP | 5-188577 | 7/1993 |
| JP | 5-217839 | 8/1993 |
| JP | 5-335204 | 12/1993 |
| JP | 7-74083 | 3/1995 |

\* cited by examiner

*Primary Examiner*—S. Rosasco
(74) *Attorney, Agent, or Firm*—McDermott, Will & Emery

(57) ABSTRACT

A reticle for use in exposing a semiconductor capable of increasing the contrast of a resist pattern to be formed on a wafer through exposure without involvement of a change in the geometry of a diaphragm plate even when a circuit pattern formed on a reticle becomes more minute; a method of producing the reticle; and a semiconductor device. The irregularities 11 are formed in the glass surface 12 of the halftone reticle 10, thus enabling uniform diffusion of the illumination light 15 over the glass surface 12. Consequently, the oblique incident light 20 effective for improving the contrast of an image to be formed on the wafer 112 can be readily and inexpensively increased without involvement of complicated processes. Even when the hole pattern 14 becomes minute, the contrast of a resist pattern to be radiated on the wafer 112 can be improved.

13 Claims, 6 Drawing Sheets

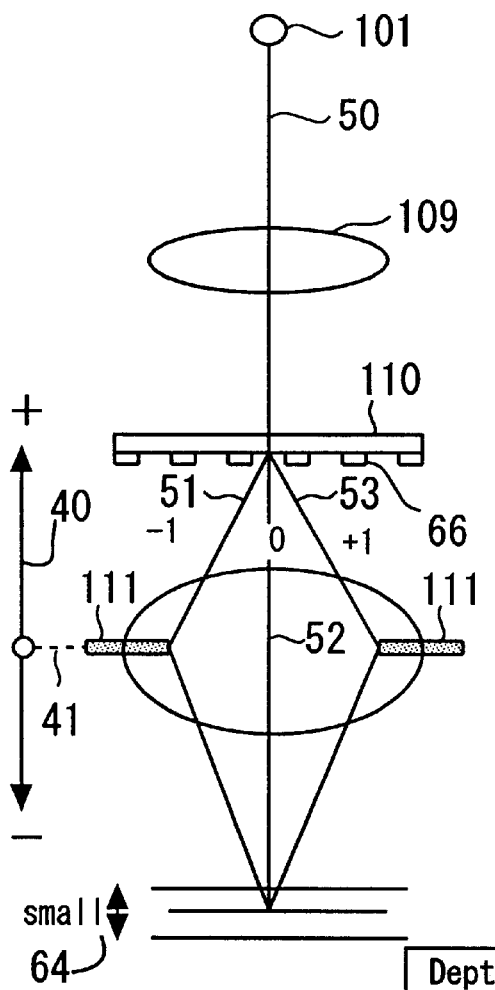
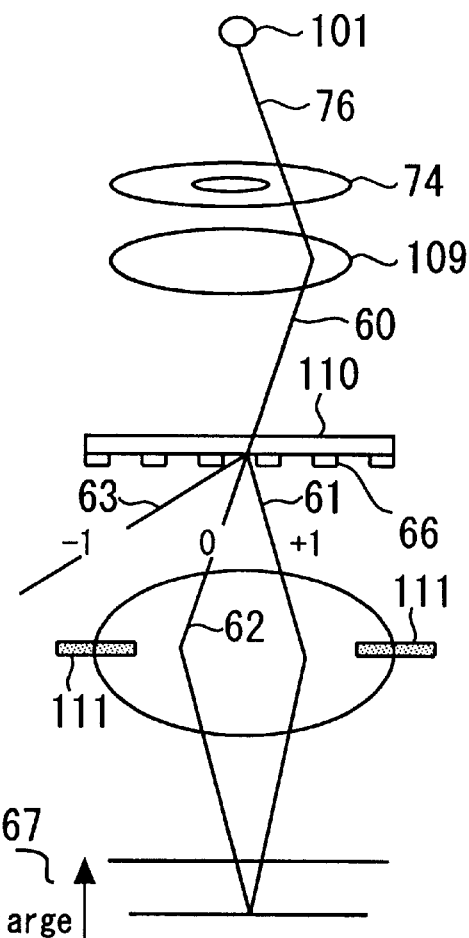
Fig. 7A
Fig. 7B

RETICLE FOR USE IN EXPOSING SEMICONDUCTOR, METHOD OF PRODUCING THE RETICLE, AND SEMICONDUCTOR DEVICE

BACKGROUND OF THE INVENTION

1. Field of the Invention

The present invention relates to a reticle for use in exposing a semiconductor, a method of producing the reticle, and a semiconductor device, and more particularly, to a reticle to be used in exposure for producing a resist pattern, a method of producing the reticle, and a semiconductor device.

2. Description of Related Art

A photolithography process for manufacturing a semiconductor device comprises a photoresist application process, an exposure process, and a development process. Of these processes, the exposure process is a process for faithfully reproducing an integrated circuit pattern formed on a reticle onto a photoresist pattern formed on a wafer, through use of a stepper. An optical reduction-projection exposure system is widely used as an exposure system.

FIG. 4 shows an optical reduction-projection exposure system 100 (hereinafter referred to as a "stepper") using a conventional reticle 110. In FIG. 4, reference numeral 101 designates a light source; 102 designates a shutter for adjusting light emitted from the light source 101; 103 designates a beam-shaping optical system for shaping the light emitted from the light source 101 by way of the shutter 102 so as to assume a desired geometry; 104 and 105 designate Fly's eye lenses for uniformly illuminating the area to be exposed; 106 designates a vibration mirror for guiding the light emitted from the Fly's eye lens 104 to the Fly's eye lens 105; 107 designates a reticle blind for covering an area on a reticle 110 other than the area onto which a circuit pattern is to be projected through exposure; 109 designates a condenser lens for illuminating the entire surface of the reticle 110; 108 designates a mirror for guiding to the condenser lens 109 the light which has passed through the reticle blind 107; 110 designates a reticle on which is formed a circuit pattern to be projected onto the wafer 112; 111 designates a reduction-projection lens for projecting, in a reduced manner and onto the wafer 112 the light which has passed through the reticle 110; and 112 designates a wafer on which a circuit pattern formed on the reticle 110 is patterned through exposure.

FIG. 5 shows diffraction of light caused when the reticle 110 is exposed to coherent light formed from a plane wave of coherent wavelength and phase. In FIG. 5, the same reference numerals as those provided in FIG. 4 designate the same elements, and hence their explanations are omitted here. In general, as shown in FIG. 5, in a case where the reticle 110 is exposed to coherent light, light 50 which has entered the reticle 110 at right angles is divided into light 52 (0-order light) which travels straight ahead and light beams 51 and 53 (±m-order light beams, where m=1, 2, 3, . . . ) which are diffracted, by the surface (lower surface) of the rectile 110. Here, provided that an angle of diffraction; for example, an angle of diffraction exemplified by an angle formed between the straightly-traveling light 52 and the diffracted light 51 is $\theta$; a pattern pitch—which is in the proportion of one line representing the width of linear patterns formed on the rectile 110 to one space representing the space between the lines—is taken as P; an index of refraction of the reticle 110 is taken as "n"; the numeric aperture expressed as NA=nsin$\theta$ is taken as NA; and the wavelength of the incident light 50 is taken as $\lambda$, there stands a relationship between the pattern pitch P and the numeric number PA, as expressed below.

$$P = m\lambda/NA \qquad (1)$$

As represented by Eq. (1), the numeric aperture NA and the angle of diffraction $\theta$ increases with a reduction in the pattern pitch P. In contrast, if the pattern pitch P is constant, diffracted light of greater order "m" has a greater numeric aperture NA, and the diffraction angle $\theta$ increases. As mentioned above, Eq. (1) represents the minimum pattern pitch P at which m-order light can be collected at the predetermined wavelength $\lambda$ and the numeric aperture NA. For instance, when the wavelength $\lambda$ is 248 nm and the numeric aperture NA is 0.55, the minimum pattern pitch P at which light of m=±1 order can be collected can be expressed as P=1×248 (nm)/0.55=451 nm=0.45 $\mu$m. In the case of a circuit pattern whose width is smaller than 0.45 $\mu$m, diffracted light of m=±1 order cannot be collected. If only 0-order light is used for exposure, an image patterned on the wafer 112 loses contrast and is not resolved. Accordingly, as a circuit pattern formed on the reticle 110 becomes more minute, the contrast of an image of the circuit pattern projected on the wafer 112 through exposure is reduced. If the circuit pattern becomes smaller than a certain size, the circuit pattern will not be resolved, thereby hindering formation of the circuit pattern (e.g., a resist pattern) onto the wafer 112.

Conventionally, to solve the foregoing problem, the contrast of an image to be resolved on the wafer 112 is increased through use of modified illumination, thereby resolving a more minute resist pattern.

FIGS. 6A and 6B are descriptive views of modified illumination, wherein FIG. 6A shows exposure without use of modified illumination and FIG. 6B shows exposure using modified illumination. In FIG. 6, those reference numerals which are the same as those provided in FIGS. 4 and 5 designate the same elements, and hence repetition of their explanations is omitted here. In FIG. 6A, reference numeral 66 designates a circuit pattern formed on the surface (lower surface) of the reticle 110; 64 designates a depth of focus of the light resolved on the wafer 112; and 65 designates the contrast of light resolved.

Modified illumination refers to an illumination technique for causing a luminous flux to which a reticle is to be exposed to enter an optical system obliquely, through use of a diaphragm provided outside the optical axis of the optical system. FIG. 6B shows a case where a luminous flux 60 of exposing radiation is caused to enter the reticle 110 obliquely through use of modified illumination. In FIG. 6B, reference numeral 62 designates 0-order light diffracted by the reticle 110; 61 designates +1-order light diffracted by the reticle 110; 63 designates −1-order light diffracted by the reticle 110; 67 designates the depth of focus (DOF) of the light resolved on the wafer 112; and 68 designates the contrast of the light resolved on the wafer 112. A comparison between exposure without use of modified illumination and exposure using modified illumination reveals that the focal depth DOF 67 is greater than the focal depth DOF 64, and that the contrast 68 is greater than the contrast 65. The contrast of the image formed on the wafer 112 can be improved by means of increasing the luminous flux of exposing radiation 60 that enters obliquely, through use of modified illumination. Consequently, a more minute resist pattern formed on the reticle 110 can be resolved.

FIGS. 7A and 7B show a case where the previously-described modified illumination is applied to a stepper 100 shown in FIG. 4, wherein FIG. 7A shows exposure without use of modified illumination and FIG. 7B shows exposure using modified illumination. In FIGS. 7A and 7B, those reference numerals which are the same as those provided in FIGS. 4 through 6 designate the same elements, and hence repetition of their explanations is omitted here. In FIG. 7A, reference numeral 109 designates a condenser lens corresponding to the previously-described condenser lens; and 40 designates the vertical distance (positive and negative) over which the stepper 100 is moved with reference to a horizontal position 41 of the reduction-projection lens 111, which is taken as 0. In FIG. 7B, reference numeral 74 designates a diaphragm plate in which a diaphragm located outside the optical axis 50 of the optical system is inserted; 76 designates a luminous flux which is emitted from the light source 101 and enters the condenser lens 109 by way of the diaphragm plate 74; and 60 designates a luminous flux which enters the reticle 110 obliquely, as has been described previously. The diaphragm 74 may be provided at the back of the Fly's eye lens 105.

As mentioned previously, oblique incident light 60 which is inclined at a certain angle with respect to the reticle 110 forms an image by means of +1-order light 61 and 0-order light 62 or by means of 0-order light 62 and −1-order light 63. For example, provided that the incident light 60 has a wavelength $\lambda$ of 248 nm and an numeric aperture NA of 0.55, the minimum pattern pitch P capable of collecting the 0-order light 62 and the +1-order light 61 or the 0-order light 62 and the −1-order light 63 is defined as P=0.45/2=0.225 $\mu$m, because the pattern pitch P merges the 0-order light and 1-order light into a single light ray. Consequently, when compared with the contrast of an image formed through exposure to only the light 50 that falls on the reticle 110 at right angles, the contrast of the image formed on the wafer 112 is increased further, hence enabling resolution of a minute resist pattern.

FIG. 8 shows details of a normal mask which has conventionally been employed for exposure through use of the previously-described modified illumination; for example, the 6-inch reticle 110. In FIG. 8, reference numeral 80 designates a flat surface of the reticle 110 on which the luminous flux of exposing radiation 60 falls and which is formed from quartz 86. Reference numeral 82 designates a pattern surface formed of a pellicle; and 88 designates a layer which is made of Cr or CrOx and is sandwiched between the glass surface 80 and the pattern surface 82.

As has been described above, the glass surface 80 of the conventional reticle 110 is flat. Consequently, in the case where modified illumination is used for exposure, there arises a problem of a necessity for modifying the geometry of the diaphragm plate 74 as a circuit pattern to be formed on the reticle 110 becomes more minute.

SUMMARY OF THE INVENTION

The present invention has been conceived to solve the above-described problem, and the object of the present invention is to provide a reticle for use in exposing a semiconductor capable of enhancing the contrast of a resist pattern to be patterned on a wafer through exposure, without involvement of a modification in the geometry of a diaphragm even when a circuit pattern to be formed on a reticle becomes more minute, as well as to provide a method of manufacturing the reticle and a semiconductor device.

According to a first aspect of the present invention, there is provided a reticle for use in exposing a semiconductor, comprising: a transmission section having a transmissivity of about 1 with respect to illumination light for exposing, and whose entrance-side surface facing the illumination light has uniform irregularities; and a semi-transmission section imparting to the illumination light passing therethrough a phase difference of about $(2n+1)\pi$ ("n" is an integer, and $\pi$ is the ratio of the circumference of a circle to its diameter), which is formed on an lower surface opposite to the entrance-side surface of the transmission section, and whose transmissivity with respect to the illumination light having passed through the transmission section is one-forth or less that of the transmission section.

According to a second aspect of the present invention, there is provided a method of producing a reticle for use in exposing a semiconductor, comprising the steps of: forming a transmission section having a transmissivity of about 1 with respect to illumination light for exposing, and whose entrance-side surface facing the illumination light has uniformly irregularities; and forming a semi-transmission section imparting to the illumination light passing therethrough a phase difference of about $(2n+1)\pi$ ("n" is an integer, and $\pi$ is the ratio of the circumference of a circle to its diameter), which is formed on a lower surface opposite to the entrance-side surface of the transmission section, and whose transmissivity with respect to the illumination light having passed through the transmission section is one-forth or less that of the transmission section.

According to a third aspect of the present invention, there is provided a semiconductor device manufactured through use of a reticle, the reticle comprising: a transmission section having a transmissivity of about 1 with respect to illumination light for exposing, and whose entrance-side surface facing the illumination light has uniform irregularities; and a semi-transmission section imparting to the illumination light passing therethrough a phase difference of about $(2n+1)\pi$ ("n" is an integer, and $\pi$ is the ratio of the circumference of a circle to its diameter), which is formed on an lower surface opposite to the entrance-side surface of the transmission section, and whose transmissivity with respect to the illumination light having passed through the transmission section is one-forth or less that of the transmission section.

The above and other objects, effects, features and advantages of the present invention will become more apparent from the following description of the embodiments thereof taken in conjunction with the accompanying drawings.

BRIEF DESCRIPTION OF THE DRAWINGS

FIGS. 6A and 6B are descriptive views of modified illumination, wherein FIG. 6A shows exposure without use of modified illumination and FIG. 6B shows exposure using modified illumination.

FIGS. 7A and 7B show a case where the previously-described modified illumination is applied to a stepper 100 shown in FIG. 4, wherein FIG. 7A shows exposure without use of modified illumination and FIG. 7B shows exposure using modified illumination.

DETAILED DESCRIPTION OF THE PREFERRED EMBODIMENTS

Figure 1:
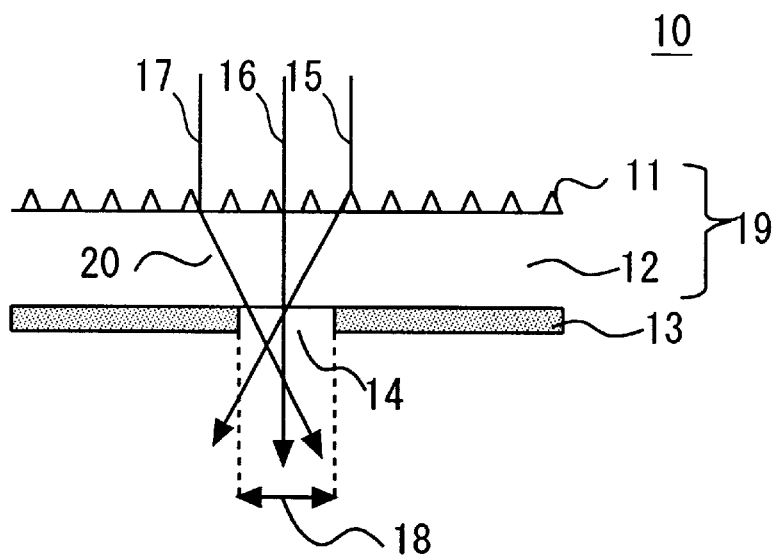
FIG. 1 shows a reticle 10 to be used in a first embodiment of the present invention.

Embodiments of the present invention will be described below with reference to the accompanying drawings. It is noted that the same reference symbols in the drawings denote the same or corresponding components.

First Embodiment

FIG. 1 shows a reticle 10 to be used in a first embodiment of the present invention. In FIG. 1, reference numerals 15, 16, and 17 designate illumination light rays which enter the reticle 10; 12 designates a glass surface of the reticle 10; 11 designates irregularities which are formed on the surface of the glass surface 12 in order to diffuse the illumination light rays 15 to 17 uniformly over the glass surface 12; 13 designates a pattern surface formed on the rectile 10; 14 designates a hole or hole pattern formed in the pattern surface 13; 18 designates the diameter of the hole 14; and 20 designates oblique incident light which enters the hole 14. The reticle 10 of the present invention can be used as the reticle 110 which is used with modified illumination through use of the stepper 100 (see FIG. 6B or 7B). The details of the stepper 100 and modified illumination have already been described previously, and hence repetition of their explanations is omitted.

In FIG. 1, the glass surface 12 and the irregularities 11 (a transmission section 19) assume a transmissivity of about 1 with respect to illumination light. The transmissivity of the pattern surface 13 (i.e. a semi-transmission section) with respect to illumination light is about one-forth that of the transmission section 19. The pattern surface 13 imparts to the illumination light which passes therethrough a phase difference of about $(2n+1)\pi$ ("n" is an integer, and $\pi$ is the ratio of the circumference of a circle to its diameter). The reticle 10 comprises the transmission section 19 and the semi-transmission section 13. Here, the reticle 10 is also called a halftone reticle. The irregularities 11 can be formed by means of processing the glass surface 12 through use of crystalline inorganic salts, such as ammonium sulfate or like chemicals. For instance, irregularities can be formed by treating the glass surface 12 with dilute sulfuric acid, and by leaving the thus-treated glass surface 12 in an ammonium atmosphere. Alternatively, the irregularities 11 can be formed in the glass surface 12 by subjecting the glass surface 12 to dry etching, such as plasma etching or sputtering etching. As mentioned previously, the irregularities 11 are formed in the glass surface 12 of the halftone reticle 10, thereby diffusing the illumination light ray 15 uniformly over glass surface 12. Accordingly, the oblique incident light 20 effective for improving the contrast of an image formed on the wafer 112 can be increased. Therefore, even when the hole pattern 14 becomes minute, the contrast of light radiated onto a resist pattern on the wafer 112 can be improved.

Figure 2:
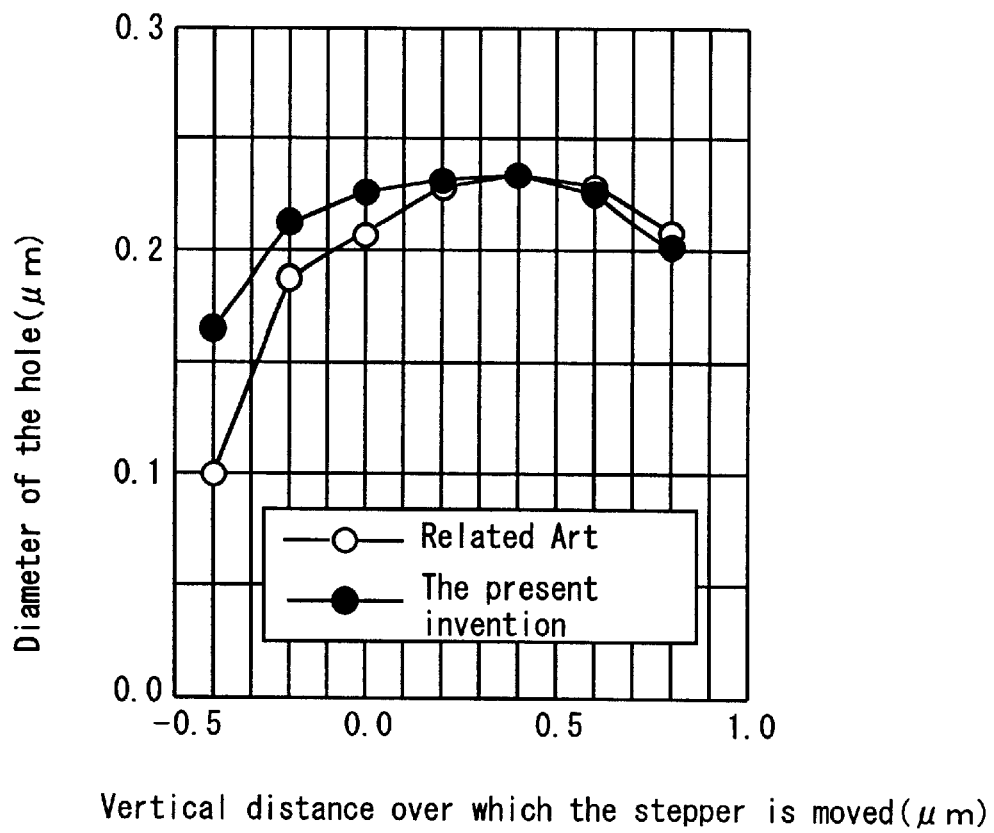
FIG. 2 shows comparison between exposure using a conventional reticle and exposure using a halftone reticle of the present invention.

FIG. 2 shows comparison between exposure using a conventional reticle and exposure using a halftone reticle of the present invention. In FIG. 2, the horizontal axis represents a vertical (negative or positive) distance 40 ($\mu$m) over which the stepper 100 is moved, and the vertical axis represents a diameter 18 ($\mu$m) of the hole 14. An open circle designates exposure using a conventional reticle, and a solid circle designates exposure using a halftone reticle of the present invention. The diameter 18 of the hole pattern 14 is 0.22 $\mu$m.

As shown in FIG. 2, on the basis of the comparison between a variation in the focus stemming from the vertical movement 40 of the stepper 100 and the margin of the diameter 18 of the hole 14, it is found that the margin of the diameter 18 of the hole 14 remains more stable against a variation in focus during the exposure using the halftone reticle of the present invention rather than against a variation in focus during the exposure using a conventional reticle.

Figure 3:
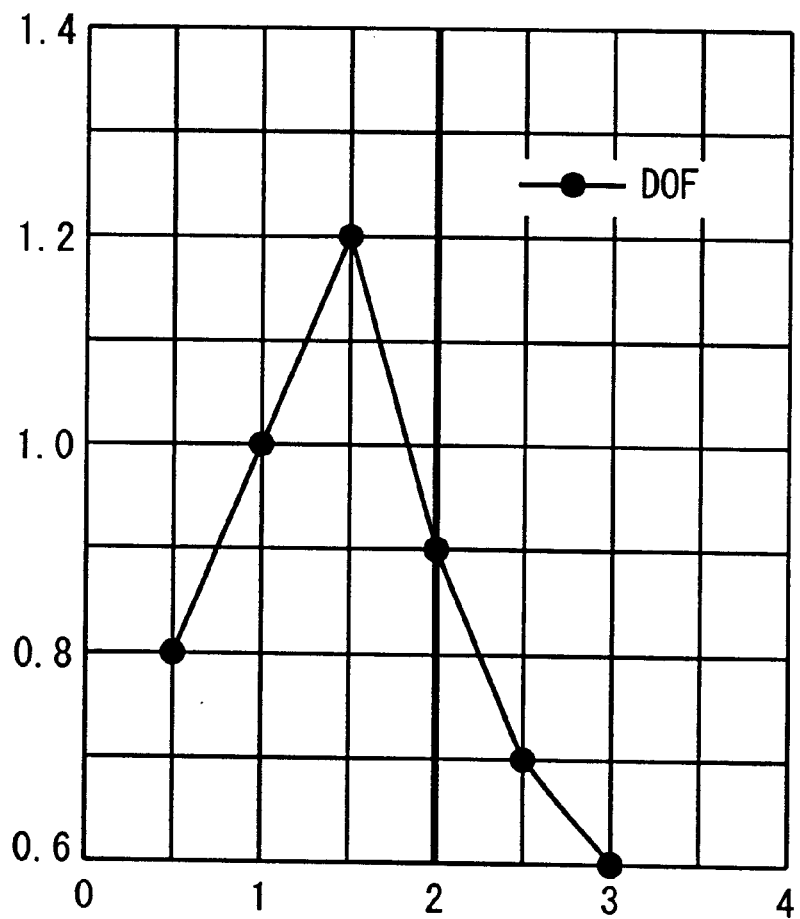
FIG. 3 shows a relationship between a reduction in the transmissivity of the illumination light 15 induced by the irregularities 11 formed in the glass surface 12 of the halftone reticle 10 of the present invention and the depth of focus obtained when the diameter 18 of the hole pattern 14 is 0.22 $\mu$m.
Figure 4:
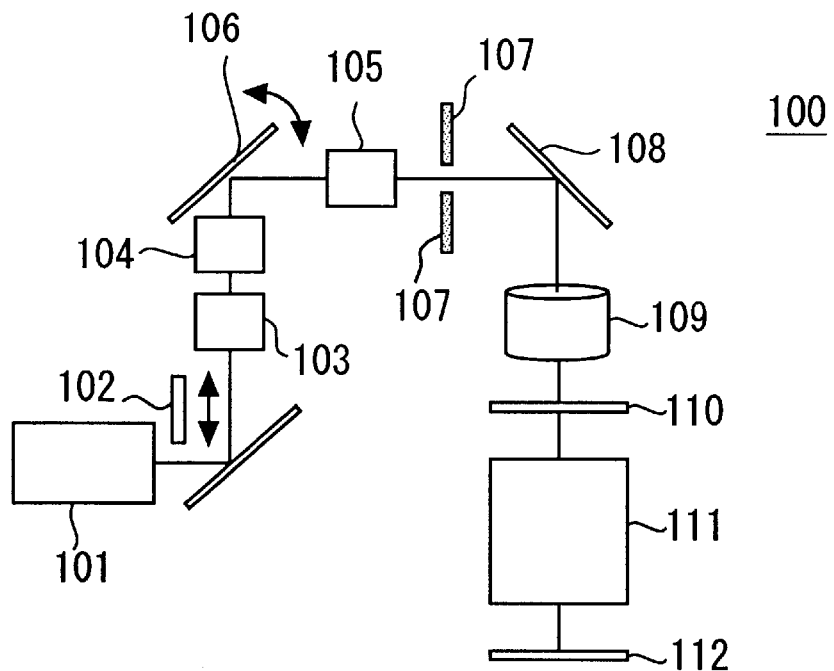
FIG. 4 shows an optical reduction-projection exposure system 100 (hereinafter referred to as a "stepper") using a conventional reticle 110.
Figure 5:
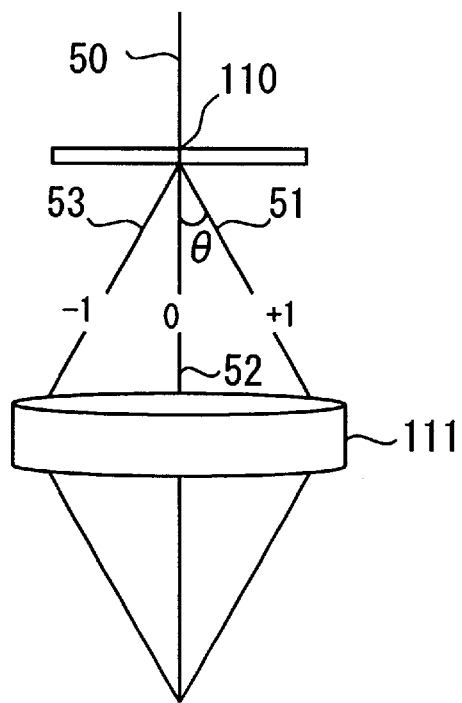
FIG. 5 shows diffraction of light caused when the reticle 110 is exposed to coherent light formed from a plane wave of coherent wavelength and phase.

FIG. 3 shows a relationship between a reduction in the transmissivity of the illumination light 15 induced by the irregularities 11 formed in the glass surface 12 of the halftone reticle 10 of the present invention and the focus margin (the depth of focus: DOF) obtained when the diameter 18 of the hole pattern 14 is 0.22 $\mu$m. In FIG. 3, the horizontal axis represents a drop in transmissivity (%), and the vertical axis represents the depth of focus of the hole pattern 14 whose diameter 18 is 0.22 $\mu$m.

As shown in FIG. 3, a peak appears in the focus margin (DOF) of the hole pattern 14 within a range of a reduction in transmissivity of less than or equal to 2%. Within a range of a reduction in transmissivity of greater than 2%, a reduction in the focus margin (DOF) according to a reduction in transmissivity is greater. Thus, a reduction in transmissivity is preferably set to a value of less than or equal to 2% in order to ensure a greater focus margin (DOF) in lower reduction in transmissivity.

According to the first embodiment, the irregularities 11 are formed in the glass surface 12 of the halftone reticle 10, thus enabling uniform diffusion of the illumination light 15 over the glass surface 12. Consequently, the oblique incident light 20 effective for improving the contrast of an image to be formed on the wafer 112 can be readily and inexpensively increased without involvement of complicated processes. Even when the hole pattern 14 becomes minute, the contrast of a resist pattern to be radiated on the wafer 112 can be improved.

Figure 6:
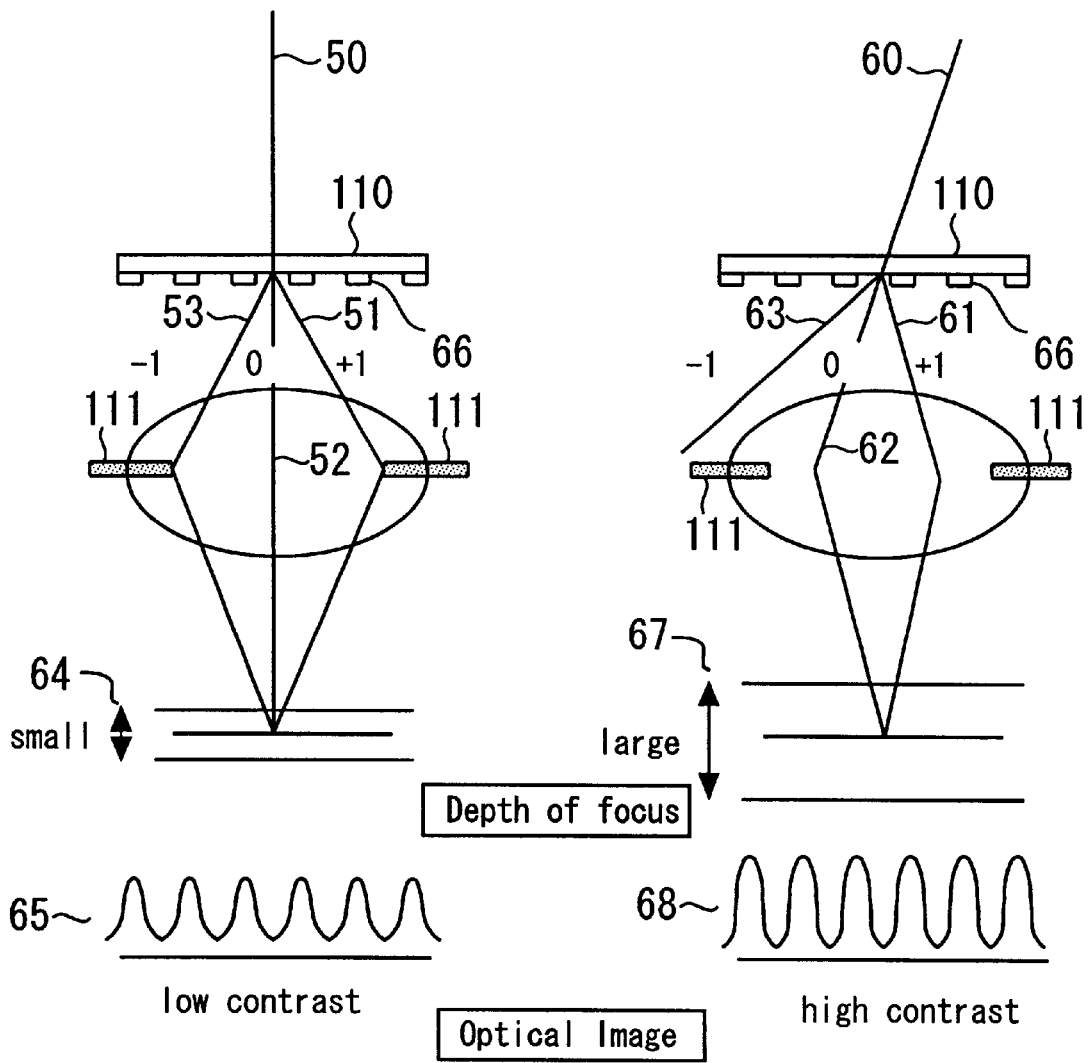
Figure 8:
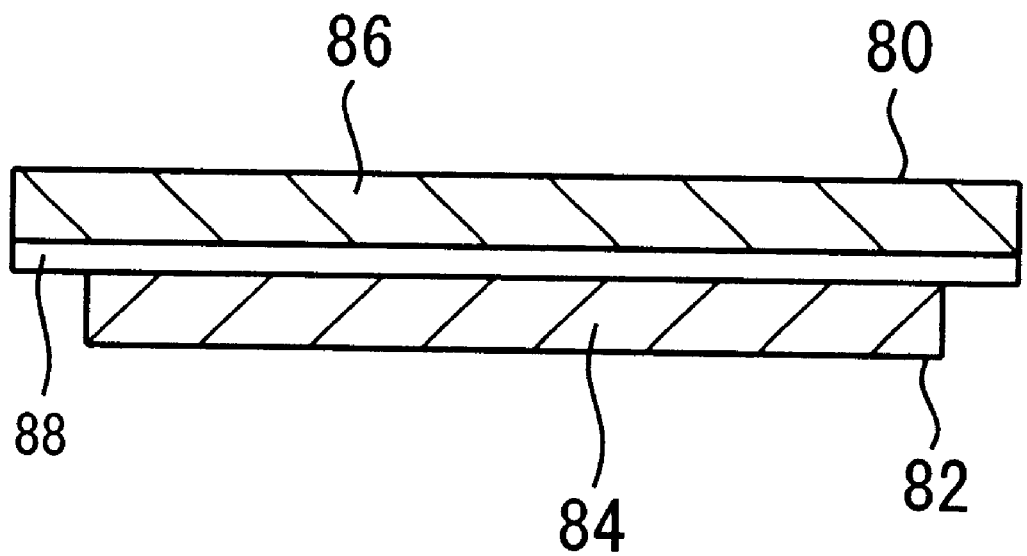
FIG. 8 shows details of a normal mask which has conventionally been employed for exposure through use of the previously-described modified illumination; for example, the 6-inch reticle 110.

The first embodiment has been described on the assumption that the reticle 10 of the present invention can be used as the reticle 110 for use with modified illumination using the stepper 100 (FIG. 6B or FIG. 7B). By virtue of the irregularities 11 formed in the glass surface 12, the reticle 10 of the present invention enables generation of the oblique incident light 20. Therefore, the reticle 10 can be used as the reticle 110 even in the case of the exposure without use of modified illumination (see FIG. 6A or 7A).

A semiconductor device can be manufactured through use of the previously-described reticle 10 of the present invention. In this case, a semiconductor device can be manufactured by projecting a circuit pattern of an IC formed on the reticle 10 onto a photoresist formed on the wafer 112, through use of the stepper 100, to thereby reproduce the circuit pattern of the reticle 10.

As has been described above, in the reticle of the present invention for use in exposing a semiconductor, the method of producing the reticle, and the semiconductor device manufactured through use of the reticle, the irregularities 11 are formed in the glass surface 12 of the halftone reticle 10, thereby uniformly diffusing the illumination light 15 over the glass surface 12 and increasing the oblique incident light 20. As a result, even when a circuit pattern formed on the reticle 110 becomes more minute, the contrast of a resist pattern to be formed on the wafer through exposure can be increased without involvement of a change in the geometry of a diaphragm plate.

In the reticle, a reduction in the transmissivity of the illumination light induced by irregularities formed in the surface of the entrance-side surface of the transmission section may be 2% or less.

In the reticle, the entrance-side surface of the transmission section may be a glass surface.

In the method of producing a reticle, in the step of forming the transmission section, the irregularities may be formed by crystallization of the entrance-side surface having uniform irregularities through use of inorganic salts.

In the method of producing a reticle, in the step of forming the transmission section, the irregularities may be formed by trimming the entrance-side surface having uniform irregularities by means of dry etching.

In the method of producing a reticle, the dry etching may be a plasma etching or a sputtering etching.

In the method of producing a reticle, the entrance-side surface may be a glass surface.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 11-280928 filed on Oct. 1, 1999 including specification, claims, drawings and summary are incorporated herein by reference in its entirety.

What is claimed is:

1. A reticle for use in exposing a semiconductor, comprising:
   a transmission section having a transmissivity of about 1 with respect to illumination light for exposing, and whose entrance-side surface facing the illumination light has uniform irregularities; and
   a semi-transmission section imparting to the illumination light passing therethrough a phase difference of about $(2n+1)\pi$("N" is an integer, and $\pi$ is the ratio of the circumference of a circle to its diameter), which is formed on a lower surface opposite to the entrance-side surface of said transmission section, and whose transmissivity with respect to the illumination light having passed through said transmission section is one-fourth or less that of said transmission section.

2. The reticle according to claim 1, wherein a reduction in the transmissivity of the illumination light induced by irregularities formed in the surface of the entrance-side surface of said transmission section is 2% or less.

3. The reticle according to claim 2, wherein the entrance-side surface of said transmission section is a glass surface.

4. The reticle according to claim 1, wherein the entrance-side surface of said transmission section is a glass surface.

5. A method of producing a reticle for use in exposing a semiconductor, comprising the steps of:
   forming a transmission section having a transmissivity of about 1 with respect to illumination light for exposing, and whose entrance-side surface facing the illumination light has uniformly irregularities; and
   forming a semi-transmission section imparting to the illumination light passing therethrough a phase difference of about $(2n+1)\pi$("n" is an integer, and $\pi$ is the ratio of the circumference of a circle to its diameter), which is formed on a lower surface opposite to the entrance-side surface of said transmission section, and whose transmissivity with respect to the illumination light having passed through said transmission section is one-fourth or less that of said transmission section.

6. The method of producing a reticle according to claim 5, wherein, in said step of forming the transmission section, the irregularities are formed by crystallization of the entrance-side surface having uniform irregularities through use of inorganic salts.

7. The method of producing a reticle according to claim 6, wherein the entrance-side surface is a glass surface.

8. The method of producing a reticle according to claim 5, wherein, in said step of forming the transmission section, the irregularities are formed by trimming the entrance-side surface having uniform irregularities by means of dry etching.

9. The method of producing a reticle according to claim 8, wherein the dry etching is a plasma etching or a sputtering etching.

10. The method of producing a reticle according to claim 9, wherein the entrance-side surface is a glass surface.

11. The method of producing a reticle according to claim 8, wherein the entrance-side surface is a glass surface.

12. The method of producing a reticle according to claim 5, wherein the entrance-side surface is a glass surface.

13. A semiconductor device manufactured through use of a reticle, the reticle comprising:
   a transmission section having a transmissivity of about 1 with respect to illumination light for exposing, and whose entrance-side surface facing the illumination light has uniform irregularities; and
   a semi-transmission section imparting to the illumination light passing therethrough a phase difference of about $(2n+1)\pi$("n" is an integer, and $\pi$ is the ratio of the circumference of a circle to its diameter), which is formed on a lower surface opposite to the entrance-side surface of said transmission section, and whose transmissivity with respect to the illumination light having passed through said transmission section is one-fourth or less that of said transmission section.

* * * * *